(12) United States Patent
Li (10) Patent No.: US 10,411,218 B2
(45) Date of Patent: Sep. 10, 2019

(54) QUASI CRYSTALLINE CONDUCTIVE PARTICLES BETWEEN A SUBSTRATE AND IC CHIP (71) Applicant: WUHAN CHINA STAR OPTOELECTRONICS SEMICONDUCTOR DISPLAY TECHNOLOGY CO., LTD., Wuhan,Hubei (CN)

(72) Inventor: Cheng Li, Hubei (CN)

(73) Assignee: WUHUN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 96 days.

(21) Appl. No.: 15/735,963

(22) PCT Filed: Dec. 5, 2017

(86) PCT No.: PCT/CN2017/114521
§ 371 (c)(1),
(2) Date: Dec. 13, 2017

(87) PCT Pub. No.: WO2019/085138
PCT Pub. Date: May 9, 2019

(65) Prior Publication Data
US 2019/0131583 A1 May 2, 2019

(51) Int. Cl.
H01L 23/48 (2006.01)
H01L 21/4763 (2006.01)
H01L 51/52 (2006.01)
H01L 23/00 (2006.01)
H01L 25/065 (2006.01)
(Continued)

(52) U.S. Cl.
CPC .......... H01L 51/5237 (2013.01); H01L 24/06 (2013.01); H01L 24/14 (2013.01); H01L 24/17 (2013.01); H01L 24/81 (2013.01); H01L 25/0657 (2013.01); C09J 9/02 (2013.01); H01L 51/0097 (2013.01); H01L 51/56 (2013.01); H01L 2251/5338 (2013.01)

(58) Field of Classification Search
CPC ..... H01L 51/5237; H01L 24/14; H01L 24/81; H01L 24/17; H01L 24/06; H01L 25/0567
See application file for complete search history.

(56) References Cited

U.S. PATENT DOCUMENTS 5,065,505 A * 11/1991 Matsubara ............. H05K 3/361
156/275.5
5,586,892 A * 12/1996 Sato ........................ H01R 4/04
174/88 R

(Continued)

Primary Examiner — Alonzo Chambliss
(74) Attorney, Agent, or Firm — Soroker Agmon Nordman (57) ABSTRACT A display device is provided in the present disclosure, which has a plurality of conductive particles in a packaging region to form an electrical connection between a plurality of first metal terminals on a surface of an array substrate and a plurality of second metal terminals on a surface of an IC chip after the array substrate and the IC chip are pressed to be bonded through a conductive adhesive. At least three of the conductive particles are distributed between the first metal terminals and the second metal terminals. A plurality of quasi-crystalline conductive particles are used to be the conductive particles.

12 Claims, 3 Drawing Sheets (51) Int. Cl.
   *H01L 51/56* (2006.01)
   *C09J 9/02* (2006.01)
   *H01L 51/00* (2006.01)

(56) References Cited

U.S. PATENT DOCUMENTS

| | | | | |
|---|---|---|---|---|
| 5,903,056 | A * | 5/1999 | Canning | H01L 24/32 |
| | | | | 257/746 |
| 5,965,064 | A * | 10/1999 | Yamada | C09J 9/02 |
| | | | | 252/512 |
| 6,332,786 | B1 * | 12/2001 | Suga | H01L 24/29 |
| | | | | 439/91 |
| 6,344,156 | B1 * | 2/2002 | Yamada | C09J 7/00 |
| | | | | 252/512 |
| 7,413,452 | B2 * | 8/2008 | Jeong | H01R 12/62 |
| | | | | 439/91 |
| 7,998,305 | B2 * | 8/2011 | Cobbley | C09J 5/00 |
| | | | | 156/330 |
| 10,080,298 | B2 * | 9/2018 | Eifuku | H05K 3/361 |
| 10,217,807 | B2 * | 2/2019 | Lee | H01L 24/29 |
| 2004/0244906 | A1 * | 12/2004 | Chuang | H01L 24/29 |
| | | | | 156/276 |
| 2017/0086310 | A1 * | 3/2017 | Li | H01B 1/20 |
| 2017/0271299 | A1 * | 9/2017 | Li | H01L 27/124 |

\* cited by examiner

| Providing the array substrate defined with a bonding region on a surface of the array substrate, wherein at least three first metal terminals are disposed apart from each other in the bonding region | — 10 |

↓

| Disposing an anisotropic conductive film on the surface of the array substrate in the bonding region, wherein the anisotropic conductive film includes a resin layer with conductive particles distributed in the resin layer, the conductive particles are over the first metal terminals in a corresponding distribution; and a plurality of quasi-crystalline conductive particles used to be the conductive particles | — 20 |

↓

| Providing the IC chip provided with at least three second metal terminals corresponding to the first metal terminals on one side of the IC chip, the IC chip aligned with the binding region, the second metal terminals being in one-to-one alignment with the first metal terminals | — 30 |

↓

| Bonding the IC chip to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the a plurality of quasi-crystalline conductive particles | — 40 |

FIG. 6

QUASI CRYSTALLINE CONDUCTIVE PARTICLES BETWEEN A SUBSTRATE AND IC CHIP

FIELD OF DISCLOSURE

The present disclosure relates to a technical field of displays, and particularly to a display device and a method for bonding an array substrate and an IC chip.

BACKGROUND OF DISCLOSURE

In a module manufacturing process for a display panel, it is required to bond an integrated circuit (IC) chip and a substrate. Current bonding methods are mainly achieved by pasting an anisotropic conductive film (ACF) on one end of a bump (which is a metal protrusion) to be bonded, and thermal pressing the other end of the bump on the ACF, and then completing a bonding process after a curing process.

Prior to thermal pressing the IC chip and the substrate, a plurality of conductive particles of the anisotropic conductive film are distributed in a resin. During the thermal pressing process, because the temperature raises to increase fluidity of the resin layer, the conducting particles, touching the bump, are forced into a gap due to bonding pressure, density of the conducting particles, which are at the gap, is greater than at the bump resulting in a short-circuit. Current methods for improving utilization of conductive particles are mainly achieved by adding a plurality of inorganic insulating particles in the anisotropic conductive film to reduce fluidity of the conductive film. However, this manner will reduce content percentage of the conductive particles in the resin. It may occur that adhesion force is reduced following a pressed process, and two ends which are pressed will be stripped off.

In summary, during the process of bonding the IC chip of the display panel in the prior art, the conductive particles distributed in a set location of the resin are affected by the fluidity of the resin, resulting in positional shifts, causing short-circuiting in the bump, thereby affecting quality of the display panel.

SUMMARY OF DISCLOSURE

An object of the present disclosure is to provide a display device, a plurality of quasi-crystalline conductive particles disposed in a packaging region of the display device, a fluidity of the conductive particles in the resin is able to reduce, so as to solve the problem that during the process of bonding the IC chip of the display panel in the prior art, the conductive particles distributed in a set location of the resin are affected by the fluidity of the resin resulting in positional shifts, causing a short-circuit in the bump, thereby affecting the quality of the display panel.

In order to resolve the above problem, the technical solution provided by the present disclosure is as follows.

A display device is provided in the present disclosure, the display device includes:
an array substrate provided with a bonding region on a surface of the array substrate, at least three first metal terminals are disposed apart from each other in the bonding region;
an anisotropic conductive film disposed on the surface of the array substrate in the bonding region, wherein the anisotropic conductive film includes a resin layer;
a plurality of conductive particles distributed in the resin layer and over the first metal terminals in a corresponding distribution, wherein the conductive particles are a plurality of quasi-crystalline conductive particles; and one of the conductive particles is shaped as a regular pentagonal dodecahedron and has planes, wherein an inclination angle θ of each of the planes with respect an adjacent plane is equal to 120 degrees; and
an IC chip provided with at least three second metal terminals corresponding to the first metal terminals on one side of the IC chip, the IC chip is aligned with the bonding region, the second metal terminals are in one-to-one alignment with the first metal terminals, the IC chip being bonded to the array substrate.

According to a preferred embodiment of the present disclosure, the IC chip is bonded to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the plurality of quasi-crystalline conductive particles.

According to a preferred embodiment of the present disclosure, the conductive particles are configured to form an electrical connection between the first metal terminals on the surface of the array substrate and the second metal terminals on a surface of the IC chip after the array substrate and the IC chip are pressed to be bonded through a conductive adhesive;
at least three of the conductive particles are distributed between the first metal terminals and the second metal terminals; and
the conductive particles are shaped to reduce a fluidity of the conductive particles in the conductive adhesive during a pressed process.

Another display device is provided in the present disclosure, the display device includes:
an array substrate provided with a bonding region on a surface of the array substrate, with at least three first metal terminals being disposed apart from each other in the bonding region;
an anisotropic conductive film disposed on the surface of the array substrate in the bonding region, wherein the anisotropic conductive film comprises a resin layer:
a plurality of conductive particles distributed in the resin layer and being over the first metal terminals in a corresponding distribution, wherein the conductive particles are a plurality of quasi-crystalline conductive particles; and
an IC chip provided with at least three second metal terminals corresponding to the first metal terminals on one side of the IC chip, the IC chip being aligned with the bonding region, the second metal terminals being in one-to-one alignment with the first metal terminals, the IC chip being bonded to the array substrate.

According to a preferred embodiment of the present disclosure, the IC chip is bonded to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the plurality of quasi-crystalline conductive particles.

According to a preferred embodiment of the present disclosure, the conductive particles are configured to form an electrical connection between the first metal terminals on the surface of the array substrate and the second metal terminals on a surface of the IC chip after the array substrate and the IC chip are pressed to be bonded through a conductive adhesive;

at least three of the conductive particles are distributed between the first metal terminals and the second metal terminals; and the conductive particles are shaped to reduce a fluidity of the conductive particles in the conductive adhesive during a pressed process.

According to the above object of the present disclosure, a method for bonding an array substrate and an IC chip is provided, the method includes:

a step S10, providing the array substrate defined with a bonding region on a surface of the array substrate, wherein at least three first metal terminals are disposed apart from each other in the bonding region;

a step S20, disposing an anisotropic conductive film on the surface of the array substrate in the bonding region, wherein the anisotropic conductive film comprises a resin layer with conductive particles distributed in the resin layer, the conductive particles are over the first metal terminals in a corresponding distribution; and a plurality of quasi-crystalline conductive particles used to be the conductive particles;

a step S30, providing the IC chip provided with at least three second metal terminals corresponding to the first metal terminals on one side of the IC chip, the IC chip aligned with the bonding region, the second metal terminals being in one-to-one alignment with the first metal terminals; and a step S40, bonding the IC chip to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the a plurality of quasi-crystalline conductive particles.

According to a preferred embodiment of the present disclosure, one of the conductive particles is shaped as a regular pentagonal dodecahedron and has planes, an inclination angle θ of each of the planes with respect an adjacent plane is equal to 120 degrees.

According to a preferred embodiment of the present disclosure, in the step S10, a surface of the one of the first metal terminals is a concave surface.

According to a preferred embodiment of the present disclosure, in the step S10, a plurality of inorganic insulating particles are disposed between two adjacent first metal terminals.

According to a preferred embodiment of the present disclosure, in the step S10, a spacing distance between two of the first metal terminals adjacent to each other is 5 to 10 times as large as a diameter of one of quasi-crystalline conductive particles.

According to a preferred embodiment of the present disclosure, in the step S20, the diameter of a plurality of quasi-crystalline conductive particles ranges from 6 to 9 microns.

According to a preferred embodiment of the present disclosure, the anisotropic conductive film is pretreated by heating, a laser, or UV irradiation.

According to a preferred embodiment of the present disclosure, the array substrate is a flexible organic light emitting diode (OLED) substrate.

The beneficial effects of the present disclosure are as follows: compared with the conductive particles in the packaging region of the display device in the prior art, the conductive particles provided by the present disclosure are quasi-crystalline conductive particles. Since each of the quasi-crystalline conductive particles has planes to reduce a fluidity of the conductive particles in the resin, it avoids the conductive particles from shifting to cause an uneven distribution of the conductive particles, leading to the problem of a short-circuit between the metal terminals on the same side. Thus, it solves the technical problem that during the process of bonding the IC chip of the display panel in the prior art, the conductive particles distributed in a set location of the resin are affected by the fluidity of the resin resulting in positional shifts, causing a phenomenon of a short-circuit in the bump, thereby affecting the quality of the display panel.

BRIEF DESCRIPTION OF DRAWINGS

To describe the technical solutions in the embodiments or in the prior art more clearly, the following briefly introduces the accompanying drawings required for describing the embodiments or the prior art. Obviously, the accompanying drawings in the following description merely illustrate to some embodiments of the present disclosure, those skilled in the art can obtain other drawings according to the accompanying drawings without creative efforts.

DETAILED DESCRIPTION OF PREFERRED EMBODIMENTS

The following description of each embodiment refers to the appended drawings for illustrating specific embodiments in which the present disclosure may be practiced. Directional terms as mentioned in the present disclosure, such as "up", "down", "front", "post", "left", "right", "inside", "outside", "lateral", etc., are merely used for the purpose of illustrating and understanding the present disclosure and are not intended to be limiting of the present disclosure. In the drawings, units with similar structures are denoted by the same reference numerals.

The present disclosure is directed at the process in the prior art of bonding the IC chip of a display panel, the conductive particles distributed in a set location of the resin are affected by the fluidity of the resin resulting in positional shifts, then to cause a phenomenon of a short-circuiting in the bump, thereby affecting the quality of the display panel. This defect will be solved in this embodiment of the present disclosure.

Figure 1:
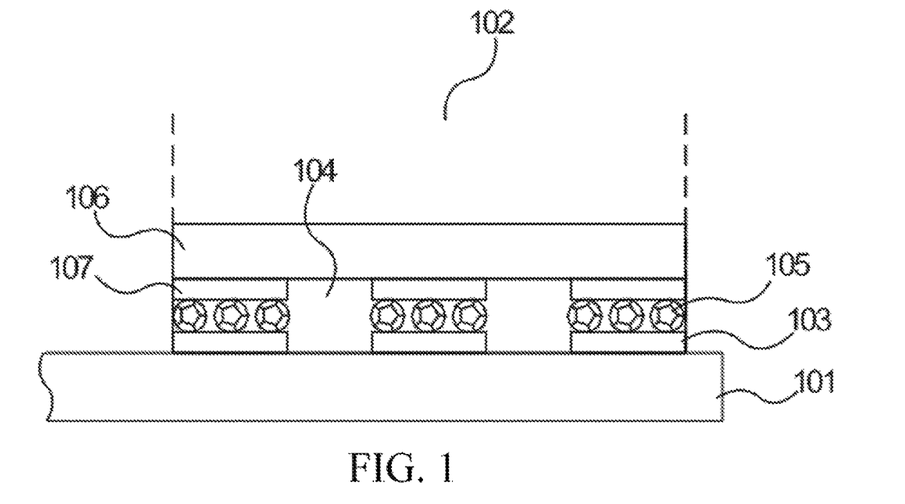
FIG. 1 is a schematic structure diagram of a display device provided in the present disclosure.

As shown in FIG. 1, a display device is provided in the present disclosure. The display device includes an array substrate 101 provided with a bonding region 102 on a surface of the array substrate 101, at least three first metal terminals 103 are disposed apart from each other in the bonding region 102; an anisotropic conductive film disposed on the surface of the array substrate in the bonding region 102, wherein the anisotropic conductive film includes a resin layer 104; a plurality of conductive particles 105 distributed in the resin layer 104 and over the first metal terminals 103 in a corresponding distribution, wherein the conductive particles 105 are a plurality of quasi-crystalline conductive particles; and an IC chip 106 provided with at least three second metal terminals 107 corresponding to the first metal terminals 103 on one side of the IC chip 106, the IC chip 106 is aligned with the bonding region 102, the second metal terminals 107 are in one-to-one alignment with the first metal terminals, and the IC chip 106 is bonded to the array substrate 101.

The IC chip 106 is bonded to the bonding region 102 of the array substrate 101 by a hot-pressing process, such that the anisotropic conductive film is fluidized by heat, the first metal terminals 103 are further contacted with the second metal terminals 107, the first metal terminals 103 and the second metal terminals 107 are bonded to the array substrate 101 by conducting through the plurality of quasi-crystalline conductive particles.

The conductive particles 105 are configured to form an electrical connection between the first metal terminals 103 on the surface of the array substrate 101 and the second metal terminals 107 on a surface of the IC chip 106 after the array substrate 101 and the IC chip 106 are pressed to be bonded through a conductive adhesive; at least three of the conductive particles 105 are distributed between the first metal terminals 103 and the second metal terminals 107; and the conductive particles 105 are shaped to reduce a fluidity of the conductive particles 105 in the conductive adhesive during a pressed process.

Figure 2:
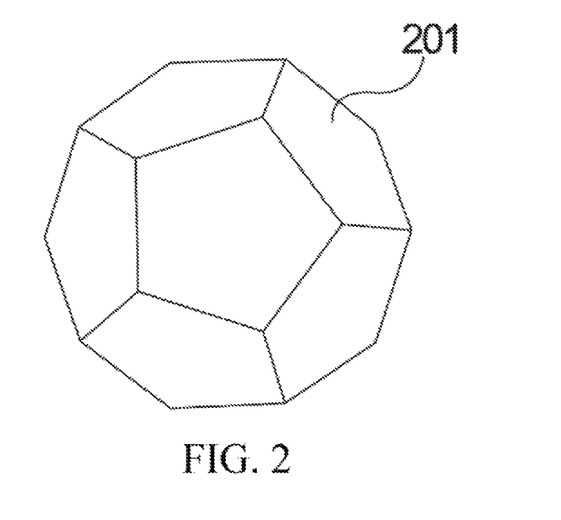
FIG. 2 is a schematic structure diagram of a quasi-crystalline conductive particle provided in the present disclosure.

As shown in FIG. 2, the conductive particles provided in the present disclosure are configured to form an electrical connection between the first metal terminals on the surface of the array substrate and the second metal terminals on a surface of the IC chip after the array substrate and the IC chip are pressed to be bonded through a conductive adhesive. The conductive particles are spheres. Since each of the spheres of the conductive particles has a smooth surface, and lacks of parts for stable support, the conductive particles easily move to two sides in a pressed direction after the conductive particles are compressed, such that the resin presents a fluid state following a heat process with a high temperature and flows around following the resin being compressed. It further promotes the spherical conductive particles being offset to the two sides, while the conductive particles provided in the present disclosure use the quasi-crystalline conductive particles 201.

The quasi-crystalline is also referred to as a "quasi-crystal" or a "mimetic crystal", which is a solid structure between a crystalline and an amorphous. In an atomic arrangement of the quasi-crystal, the structure is long-range and orderly, that is similar to the crystalline, but the quasi-crystal does not have a characteristic of translational symmetry, it is different form the crystalline. Ordinary crystals have a characteristic of second, third, fourth, or sixth-order rotational symmetry, but a Prague diffraction pattern of the quasi-crystal has other symmetries such as fifth-symmetry or symmetries higher than sixth. Therefore, the quasi-crystalline has a polyhedral symmetric structure.

Figure 3:
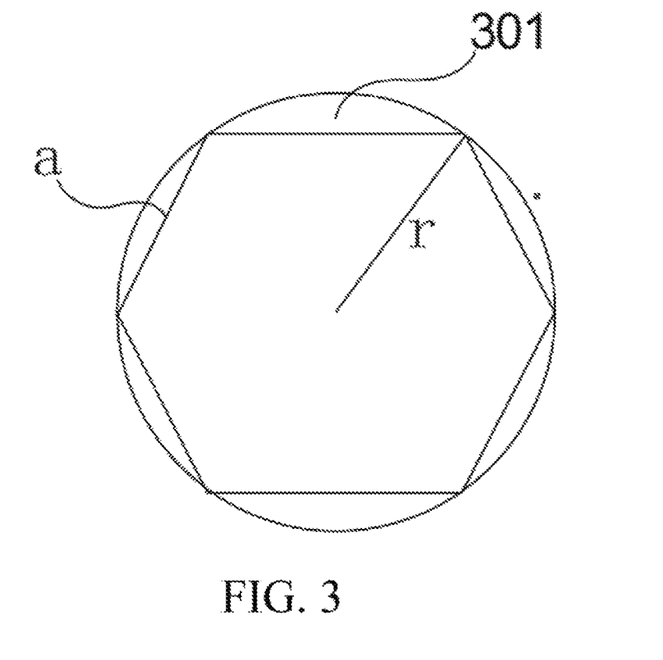
FIG. 3 is a schematic view of cylindrical cut surfaces of the quasi-crystalline conductive particle provided in the present disclosure.

As shown in FIG. 3, the quasi-crystalline conductive particles are provided in the present disclosure, each of those shapes is shaped as a regular pentagonal dodecahedron about a Prato stereoscopic vision and has planes, an inclination angle θ of each of the planes with respect to an adjacent plane is equal to 120 degrees. In outer circular section faces of each of the quasi-crystalline conductive particles, each of the quasi-crystalline conductive particles includes a quasi-crystalline side surface 301 and a quasi-crystalline side edge α, and a distance between a center of the outer circular section faces and a connecting point of any adjacent two quasi-crystalline side edges α is a radius r of one of the quasi-crystalline conductive particles, wherein, the radius $$r = \frac{\sqrt{3} + \sqrt{15}}{4} \times a,$$

wherein α is a length of the quasi-crystalline side edge.

Figure 4:
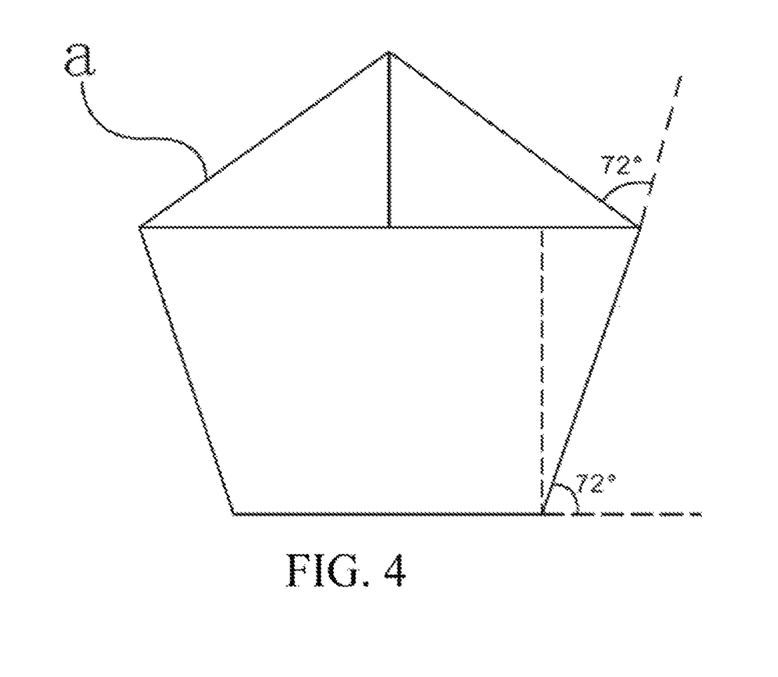
FIG. 4 is a schematic view of a contact surface of the quasi-crystalline conductive particle provided in the present disclosure.

As shown in FIG. 4, a contact area between two adjacent quasi-crystalline conductive particles is a pentagonal plane, the area of the pentagonal plane is as follows. $S_{quasi-crystalline} = a^2 \times (1 + \cos 72°) \times \sin 72° + a^2 \times (1 + 2 \cos 72°) \times 0.3$, wherein a is one of side lengths of the pentagonal plane.

If the contact area between adjacent two of the quasi-crystalline conductive particles is larger, then the attraction between the conductive particles is greater, such that the quasi-crystalline conductive particles are combined together to be more stable, which is not easily offset by external forces.

Figure 5:
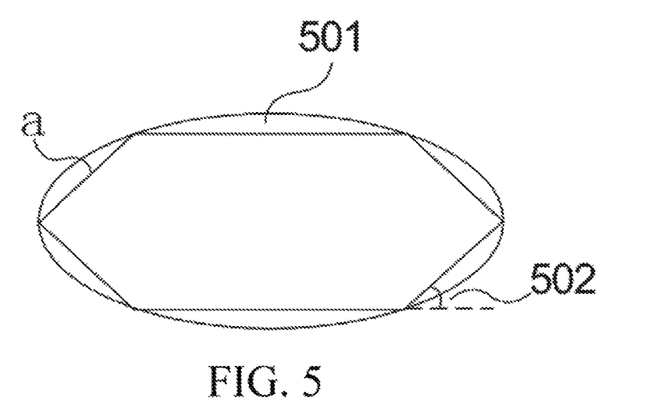
FIG. 5 is a schematic view of cylindrical cut surfaces of the quasi-crystalline conductive particle provided in the present disclosure after a deformation.

As shown in FIG. 5, in outer circular section faces of each of the quasi-crystalline conductive particles, each of the quasi-crystalline conductive particles includes a quasi-crystalline side surface 501 and a quasi-crystalline side edge α. When the quasi-crystalline conductive particles deform under stress, a deformation rate of 60% to 80%, in a case of an average deformation value is equal to 70% of an ideal deformation, the contact area is $$S_{deformed\ sphere} = 0.91 \times \pi \times r^2 = \frac{(9 + 3\sqrt{5})}{8} \times a^2,$$

wherein α is a length of the quasi-crystalline side edge.

After a quantization of the above areas, $S_{quasi-crystalline} = 1.73 \times a^2 < 1.963 \times a^2 = S_{deformed\ sphere}$, wherein α is a length of the quasi-crystalline side edge. Thus, a structure of the quasi-crystalline is more stable. However, since the nature of raw material has a certain deformation rate, if the deformation rate is maximized to 80%, the maximum inclination angle of each of the planes of the quasi-crystalline with respect to an adjacent plane of the quasi-crystalline is equal to θ=162°<180° to maintain a greater responsive rate.

After each of the quasi-crystalline conductive particles is compressed to deform, a deformed angle 402 is generated, the inclination angle of each of the planes with respect to an adjacent plane is decreased, and a lateral length of each of the quasi-crystalline conductive particles is longer, thereby increasing a supporting area of each of the quasi-crystalline conductive particles to decrease a rolling inertia.

Figure 6:
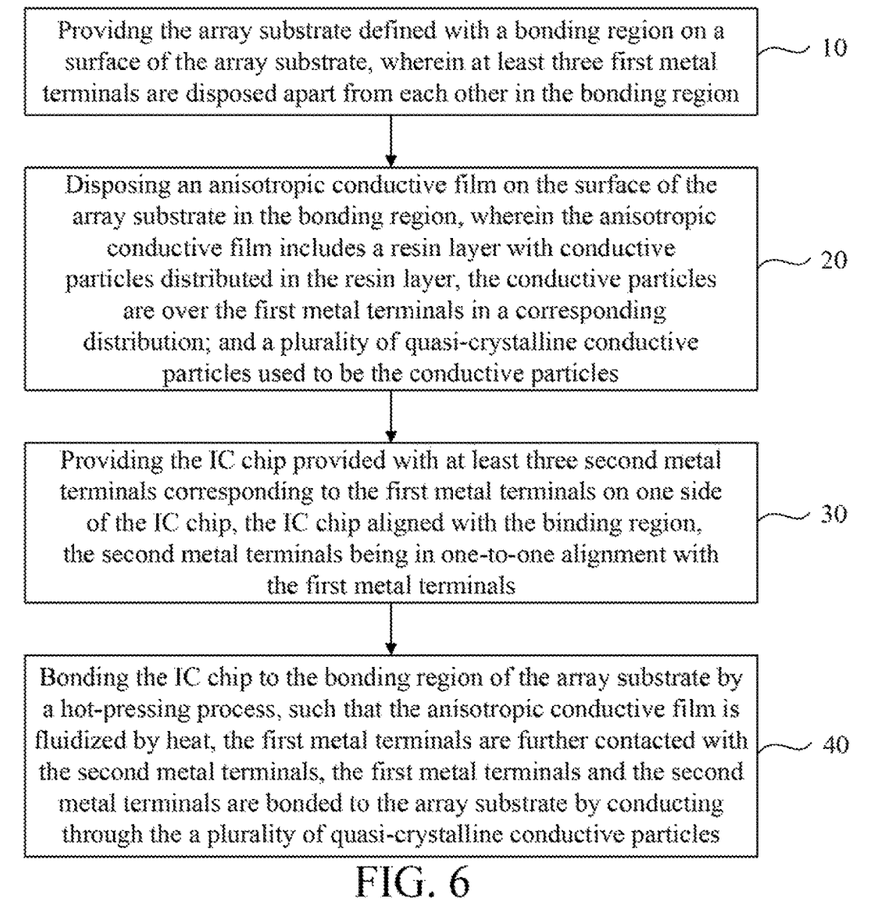
FIG. 6 is a flowchart of a method for bonding an array substrate and an IC chip provided in the present disclosure.

According to the above purpose of the present disclosure, as shown in FIG. 6, a method for bonding an array substrate and an IC chip is provided, the method includes the following steps.

In a step S10, providing the array substrate defined with a bonding region on a surface of the array substrate, wherein at least three first metal terminals are disposed apart from each other in the bonding region.

In a step S20, disposing an anisotropic conductive film on the surface of the array substrate in the bonding region, wherein the anisotropic conductive film includes a resin layer with conductive particles distributed in the resin layer, the conductive particles are over the first metal terminals in a corresponding distribution; and a plurality of quasi-crystalline conductive particles used to be the conductive particles.

In a step S30, providing the IC chip with at least three second metal terminals corresponding to the first metal terminals on one side of the IC chip, the IC chip aligned with the bonding region, the second metal terminals being in one-to-one alignment with the first metal terminals.

In a step S40, bonding the IC chip to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the a plurality of quasi-crystalline conductive particles.

One of the conductive particles is shaped as a regular pentagonal dodecahedron and has planes, an inclination angle θ of each of the planes with respect to an adjacent plane is equal to 120 degrees.

In the step S10, a surface of the one of the first metal terminals is a concave surface. Both sides of the concave surface have a gradient, which is able to limit a movement of the quasi-crystalline conductive particles aligned with a surface of one of the first metal terminals, and to avoid the quasi-crystalline conductive particles shifting and collecting between two adjacent first metal terminals.

In the step S10, a plurality of inorganic insulating particles are disposed between two adjacent first metal terminals. The inorganic insulating particles are configured to form an insulation between two of the first metal terminals adjacent to each other. It is to avoid a short-circuit between two of the first metal terminals adjacent to each other due to the quasi-crystalline conductive particles shift. In addition, a stacked height of the inorganic insulating particles is greater than a height of one of the first metal terminals.

In the step S10, a spacing distance between two of the first metal terminals adjacent to each other is 5 to 10 times as large as a diameter of one of quasi-crystalline conductive particles. Thus, a probability of a short-circuiting between any two of the first metal terminals is reduced by increasing the spacing distance between two of the first metal terminals adjacent to each other.

In the step S20, the diameter of a plurality of quasi-crystalline conductive particles ranges from 6 to 9 microns. The anisotropic conductive film is pretreated by heating, a laser, or UV irradiation.

The beneficial effects of the present disclosure are as follows: compared with the conductive particles in the packaging region of the display device in the prior art, the conductive particles provided by the present disclosure are the quasi-crystalline conductive particles, since each of the quasi-crystalline conductive particles has planes to reduce a fluidity of the conductive particles in the resin. This avoids the conductive particles shifting and causing an uneven distribution of the conductive particles, leading to the problem of a short-circuit between the metal terminals on the same side. Thus, it solves the technical problem that during the process of bonding the IC chip process of the display panel in the prior art, the conductive particles distributed in a set location of the resin are affected by the fluidity of the resin resulting in positional shifts, causing a phenomenon of a short-circuit in the bump, thereby affecting the quality of the display panel.

While the present disclosure has been disclosed with reference to preferred embodiments, the above-described embodiments are not intended to limit the present disclosure, and a person having ordinary skill in the art will be able to make various changes and modifications without departing from the spirit and scope of the present disclosure, and thus the scope of the present disclosure is defined by the scope of the claims.

What is claimed is:

1. A display device, comprising:
    an array substrate provided with a bonding region on a surface of the array substrate, at least three first metal terminals, being disposed apart from each other, in the bonding region;
    an anisotropic conductive film disposed on the surface of the array substrate in the bonding region, wherein the anisotropic conductive film comprises a resin layer;
    a plurality of conductive particles distributed in the resin layer and overing the first metal terminals in a corresponding distribution, wherein the conductive particles are a plurality of quasi-crystalline conductive particles; and
    wherein one of the conductive particles is shaped as a regular pentagonal dodecahedron and has planes, wherein an inclination angle θ of each of the planes with respect to an adjacent plane is equal to 120 degrees; and
    an IC chip provided with at least three second metal terminals corresponding to the first metal terminals on one side of the IC chip, the IC chip aligned with the bonding region, the second metal terminals in one-to-one alignment with the first metal terminals, the IC chip bonded to the array substrate.

2. The display device as claimed in claim 1, wherein the IC chip is bonded to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the plurality of quasi-crystalline conductive particles.

3. The display device as claimed in claim 1, wherein the conductive particles are configured to form an electrical connection between the first metal terminals on the surface of the array substrate and the second metal terminals on a surface of the IC chip after the array substrate and the IC chip are pressed to be bonded through a conductive adhesive;
    at least three of the conductive particles are distributed between the first metal terminals and the second metal terminals; and
    the conductive particles are shaped to reduce fluidity of the conductive particles in the conductive adhesive during a pressed process.

4. A display device, comprising:
    an array substrate provided with a bonding region on a surface of the array substrate, with at least three first metal terminals being disposed apart from each other in the bonding region;
    an anisotropic conductive film disposed on the surface of the array substrate in the bonding region, wherein the anisotropic conductive film comprises a resin layer;
    a plurality of conductive particles distributed in the resin layer and being over the first metal terminals in a corresponding distribution, wherein the conductive particles are a plurality of quasi-crystalline conductive particles; and an IC chip provided with at least three second metal terminals corresponding to the first metal terminals on one side of the IC chip, the IC chip being aligned with the bonding region, the second metal terminals being in one-to-one alignment with the first metal terminals, the IC chip being bonded to the array substrate.

5. The display device as claimed in claim 4, wherein the IC chip is bonded to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the a plurality of quasi-crystalline conductive particles.

6. The display device as claimed in claim 4, wherein the conductive particles are configured to form an electrical connection between the first metal terminals on the surface of the array substrate and the second metal terminals on a surface of the IC chip after the array substrate and the IC chip are pressed to be bonded through a conductive adhesive;
- at least three of the conductive particles are distributed between the first metal terminals and the second metal terminals; and
- the conductive particles are shaped to reduce a fluidity of the conductive particles in the conductive adhesive during the pressed process.

7. A method for bonding an array substrate and an IC chip, comprising:
- a step S10, providing the array substrate defined with a bonding region on a surface of the array substrate, wherein at least three first metal terminals are disposed apart from each other in the bonding region;
- a step S20, disposing an anisotropic conductive film on the surface of the array substrate in the bonding region, wherein the anisotropic conductive film comprises a resin layer with conductive particles distributed in the resin layer, the conductive particles are over the first metal terminals in a corresponding distribution; and a plurality of quasi-crystalline conductive particles used to be the conductive particles;
- a step S30, providing the IC chip provided with at least three second metal terminals corresponding to the first metal terminals on one side of the IC chip, the IC chip aligned with the bonding region, the second metal terminals being in one-to-one alignment with the first metal terminals; and
- a step S40, bonding the IC chip to the bonding region of the array substrate by a hot-pressing process, such that the anisotropic conductive film is fluidized by heat, the first metal terminals are further contacted with the second metal terminals, the first metal terminals and the second metal terminals are bonded to the array substrate by conducting through the a plurality of quasi-crystalline conductive particles.

8. The method for bonding the array substrate and the IC chip as claimed in claim 7, wherein one of the conductive particles is shaped as a regular pentagonal dodecahedron and has planes, an inclination angle θ of each of the planes with respect to an adjacent plane is equal to 120 degrees.

9. The method for bonding the array substrate and the IC chip as claimed in claim 7, wherein in the step S10, a surface of the one of the first metal terminals is a concave surface.

10. The method for bonding the array substrate and the IC chip as claimed in claim 7, wherein in the step S10, a plurality of inorganic insulating particles are disposed between two adjacent first metal terminals.

11. The method for bonding the array substrate and the IC chip as claimed in claim 7, wherein in the step S10, a spacing distance between two of the first metal terminals adjacent to each other is 5 to 10 times as large as a diameter of one of quasi-crystalline conductive particles.

12. The method for bonding the array substrate and the IC chip as claimed in claim 11, wherein in the step S20, the diameter of a plurality of quasi-crystalline conductive particles ranges from 6 to 9 microns.

* * * * *

UNITED STATES PATENT AND TRADEMARK OFFICE
CERTIFICATE OF CORRECTION

PATENT NO. : 10,411,218 B2
APPLICATION NO. : 15/735963
DATED : September 10, 2019
INVENTOR(S) : Cheng Li Page 1 of 1

It is certified that error appears in the above-identified patent and that said Letters Patent is hereby corrected as shown below:

On the Title Page

Item (73), ASSIGNEE:
Delete "WUHUN CHINA STAR OPTOELECTRONICS SEMICONDUCTOR DISPLAY TECHNOLOGY CO., LTD." and insert -- WUHAN CHINA STAR OPTOELECTRONICS SEMICONDUCTOR DISPLAY TECHNOLOGY CO., LTD. --.

Item (30), Column 1, insert:
-- (30) Foreign Application Priority Data
Oct. 30, 2017 (CN) .......................... 201711030358.9 --.

Signed and Sealed this
Nineteenth Day of November, 2019

Andrei Iancu
*Director of the United States Patent and Trademark Office*